United States Patent
Moens et al.

(10) Patent No.: US 10,269,947 B1
(45) Date of Patent: Apr. 23, 2019

(54) ELECTRONIC DEVICE INCLUDING A TRANSISTOR INCLUDING III-V MATERIALS AND A PROCESS OF FORMING THE SAME

(71) Applicant: SEMICONDUCTOR COMPONENTS INDUSTRIES, LLC, Phoenix, AZ (US)

(72) Inventors: Peter Moens, Erwetegem (BE); Piet Vanmeerbeek, Sleidinge (BE); Abhishek Banerjee, Kruibeke (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/916,428

(22) Filed: Mar. 9, 2018

(51) Int. Cl.
| | |
|---|---|
| *H01L 29/66* | (2006.01) |
| *H01L 29/778* | (2006.01) |
| *H01L 29/20* | (2006.01) |
| *H01L 29/417* | (2006.01) |
| *H01L 29/423* | (2006.01) |

(52) U.S. Cl.
CPC ...... *H01L 29/7783* (2013.01); *H01L 29/2003* (2013.01); *H01L 29/41758* (2013.01); *H01L 29/42364* (2013.01); *H01L 29/66462* (2013.01)

(58) Field of Classification Search
USPC .......... 257/194, E29.246–E29.253, E21.403, 257/E21.407, 256; 438/157, 172
See application file for complete search history.

(56) References Cited

U.S. PATENT DOCUMENTS

| | | | |
|---|---|---|---|
| 9,673,311 B1* | 6/2017 | Moens | H01L 29/66462 |
| 2002/0167023 A1* | 11/2002 | Chavarkar | H01L 29/7783 257/194 |
| 2003/0218183 A1* | 11/2003 | Micovic | H01L 21/28575 257/192 |
| 2009/0146185 A1 | 6/2009 | Suh et al. | |

(Continued)

OTHER PUBLICATIONS

Okita, Hideyuki et al., "Through Recessed and Regrowth Gate Technology for Realizing Process Stability of GaN-GITs", Proceedings of the 2016 28th International Symposium on Power Semiconductor Devices and ICs (ISPSD), dated 2016, Prague, Czech Republic, pp. 23-26.

*Primary Examiner* — Niki H Nguyen
(74) *Attorney, Agent, or Firm* — Abel Schillinger, LLP

(57) ABSTRACT

An electronic device can include a transistor. The transistor can include a first layer including a first III-V material, a second layer overlying the first layer and including a second III-V material, and a third layer overlying the first layer and including a third III-V material. In an embodiment, each of the first and second layers includes Al, and the second layer has a higher Al content as compared to the first layer. In another embodiment, the transistor can further include a gate dielectric layer overlying the third layer, and a gate electrode of the transistor overlying the gate dielectric layer and the third layer. The transistor can be an enhancement-mode high electron mobility transistor. The configuration of layers can allow for a relatively higher threshold voltage, as compared to conventional enhancement-mode high electron mobility transistor, to be achieved without significantly affecting $R_{DSON}$.

20 Claims, 2 Drawing Sheets

(56) References Cited

U.S. PATENT DOCUMENTS

| | | |
|---|---|---|
| 2013/0126889 A1 | 5/2013 | Bahl |
| 2014/0374765 A1* | 12/2014 | Curatola ............ H01L 29/7783 |
| | | 257/76 |
| 2015/0187924 A1 | 7/2015 | Dasgupta et al. |
| 2017/0125572 A1* | 5/2017 | Curatola ............ H01L 29/0891 |
| 2017/0294530 A1 | 10/2017 | Moens et al. |
| 2017/0373177 A1* | 12/2017 | Benkhelifa ......... H01L 29/1075 |

* cited by examiner

ELECTRONIC DEVICE INCLUDING A TRANSISTOR INCLUDING III-V MATERIALS AND A PROCESS OF FORMING THE SAME

FIELD OF THE DISCLOSURE

The present disclosure relates to electronic devices and processes of forming electronic devices, and more particularly to, electronic devices including transistors that include III-V materials and processes of forming the same.

RELATED ART

A high electron mobility transistor can include a GaN channel layer and an overlying AlGaN barrier layer. The transistor can be configured as a depletion-mode transistor or an enhancement-mode transistor. As a depletion-mode transistor, a two dimension electron gas is at a heterojunction between a GaN channel layer and an AlGaN barrier layer and underlies the source, gate, and drain electrodes of the transistor. In an enhancement-mode transistor, a p-type GaN layer may be part of the gate of the transistor, wherein the gate is spaced apart from the channel layer by greater than 2 nm of the AlGaN layer. The enhancement-mode has a threshold voltage of less than 1 V. Further improvement of enhancement-mode high electron mobility transistors is desired.

BRIEF DESCRIPTION OF THE DRAWINGS

Embodiments are illustrated by way of example and are not limited in the accompanying figures.

Figure 1:
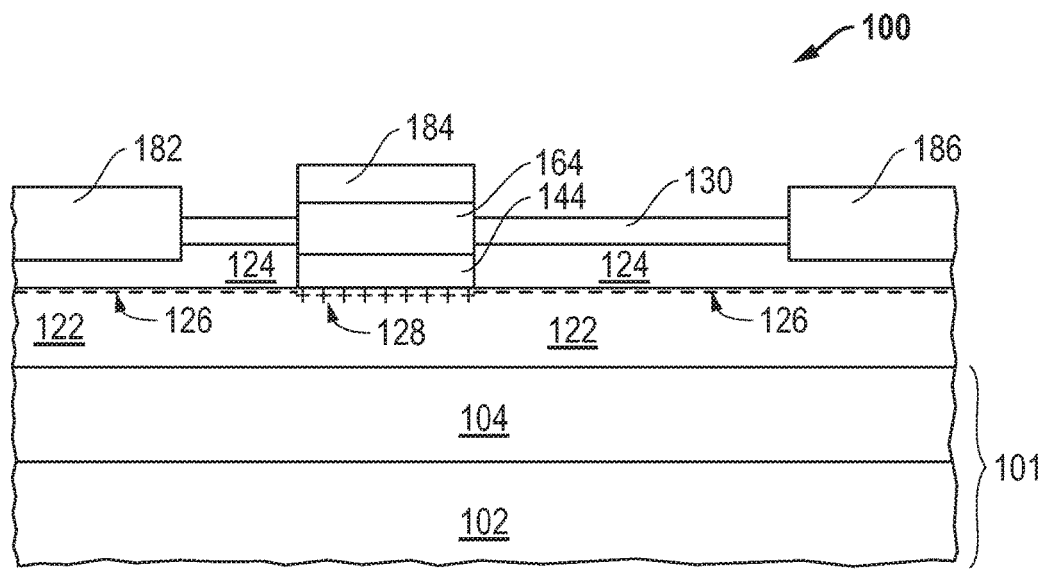
FIG. 1 includes an illustration of a cross-sectional view of a portion of a workpiece including an enhancement-mode high electron mobility transistor.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

A III-V material is intended to mean a material that includes at least one Group 13 and at least one Group 15 element. A III-N material is intended to mean a semiconductor material that includes at least one Group 13 element and nitrogen.

The term "power transistor" is intended to mean a transistor that is designed to normally operate with at least a 30 V difference maintained between the source and drain of the transistor or emitter and collector of the transistor when the transistor is in an off-state. For example, when the transistor is in an off-state, a 30 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An enhancement-mode high electron mobility transistor (HEMT) can have a threshold voltage greater than 1 V and allow for better control of the HEMT as compared to conventional enhancement-mode HEMTs. The HEMT can have an on-state resistance ($R_{DSON}$) that is similar to a depletion-mode HEMT having an unintentionally doped GaN channel layer and an AlGaN barrier layer overlying the channel layer and similar source-to-gate and gate-to-drain lengths.

In an aspect, an electronic device can include a transistor. The transistor can include a first layer including a first III-V material, a second layer overlying the first layer and including a second III-V material, and a third layer overlying the first layer and including a third III-V material. The first, second, and third layers can have different compositions as compared to one another. In an embodiment, each of the first and second layers includes Al, and the second layer has a higher Al content as compared to the first layer. The third layer has a lower Al content than the first layer 122 and can include $Al_zGa_{(1-z)}N$, wherein $0.00 \leq z \leq 0.10$ and at least partially extending through the second layer. In a particular embodiment, the third layer includes GaN. In another embodiment, the transistor can further include a gate dielectric layer overlying the third layer, and a gate electrode of the transistor overlying the gate dielectric layer and the third layer. The second layer has a first portion coupled to a source electrode of the transistor and a second portion coupled to a drain electrode of the transistor. The third layer is disposed between the first and second portions of the second layer.

In another aspect, a process of forming an electronic device can include forming a first layer over a substrate, wherein the first layer includes a first III-V material having a first Al content; forming a second layer contacting the first layer and including a second III-V material having a second Al content that is greater than the first Al content; and forming a third layer over the first layer and at least partially extending through the second layer, wherein the third layer has a lower Al content than the first layer 122 and can include $Al_zGa_{(1-z)}N$, wherein $0.00 \leq z \leq 0.10$. In a particular embodiment, the third layer includes GaN. The concepts are better understood after reading the remainder of this specification in conjunction with the drawings.

FIG. 1 includes a cross-sectional view of a portion of a workpiece that includes a HEMT 100. The HEMT 100 can include a substrate 101 that includes a base material 102 and a high-voltage blocking layer 104. The base material 102 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the high-voltage blocking layer 104 that will be subsequently formed over the base material 102. The high-voltage blocking layer 104 can include a plurality films. The composition and thickness of the high-voltage blocking layer 104 may depend on normal operating of the HEMT 100 and the composition of the overlying layers.

Each of the films within the high-voltage blocking layer 104 can include a III-N material, and in a particular embodiment include $Al_xGa_{(1-x)}N$, where $0 \leq x \leq 1$. The composition of the high-voltage blocking layer 104 can be changed as a function of thickness, such that the high-voltage blocking layer 104 has a relatively greater aluminum content closer to the base material 102 and relatively greater gallium content closer to the layer 122. The high-voltage blocking layer 104 can have a thickness in a range of approximately 1 micron to 5 microns.

Heterojunctions lie at the interface between the layers 122 and 124 and between the layers 122 and 144. Each of the layers 122, 124, and 144 can include a III-V semiconductor material. Each of the layers 122, 124, and 144 can have a different composition as compared to one another. The III-V semiconductor material can include GaN, AlGaN, InGaN, InAlGaN, InP, or the like. The layer 124 can have a greater Al content as compared to the layer 122. In an embodiment, based on cation content, the layer 124 can have an Al content that is 15 atomic % to 30 atomic % more than the layer 122. In a particular embodiment, the layer 122 includes $Al_xGa_{(1-x)}N$, wherein $0.05 \leq x \leq 0.20$, and in another particular embodiment, the layer 124 includes $Al_yGa_{(1-y)}N$, wherein $0.20 \leq y \leq 0.50$. A two-dimensional electron gas 126 is at the junction of the layers 122 and 124. The layer 122 can have a thickness in a range of 20 nm to 2000 nm. The layer 124 can have a thickness in a range of 4 nm to 100 nm, and in an embodiment, the layer 124 may have a thickness no greater than 50 nm.

A capping layer 130 overlies the layer 124. The capping layer 130 can be used to protect the layer 124. The capping layer 130 can include silicon nitride and have a thickness in a range of approximately 20 nm to 500 nm.

The layers 124 and 130 can include portions between which the layer 144 and a gate dielectric layer 164 lie. In the embodiment as illustrated in FIG. 1, the portions of the layer 124 are spaced apart from each other by a space, and the layer 144 is disposed within the space. The layer 144 can contact the layer 122. In an embodiment, the layer 144 is recessed within the layer 122. In an embodiment, the layer 144 is recessed by no more than 10 nm into the layer 122. A two-dimension hole gas 128 lies at the interface between the layers 122 and 144.

In another embodiment, the layer 144 may not be recessed within the layer 122. A thin strip of the layer 124 may be disposed between the layers 122 and 144. The thin strip of the layer 124 has a thickness sufficiently thin to allow the two-dimension hole gas 128 to form below the layer 144. In an embodiment, the thin strip has a thickness of at most 2 nm.

The layer 144 can include an unintentionally doped or p-type doped GaN. As used in this specification, unintentionally doped refers to doping that may occur based on how a layer is formed although no doping may be desired. For example, trimethyl gallium ($Ga(CH_3)_3$) can react with ammonium ($NH_3$) in forming GaN. Some carbon from the gallium source may be incorporated into the GaN layer. For an unintentionally doped layer, the dopant concentration is less than $5 \times 10^{16}$ atoms/cm$^3$. When the layer 144 is p-type doped, Mg, Ca, Be, or the like can be used as a dopant, and the dopant concentration can be at least $5 \times 10^{16}$ atoms/cm$^3$ and up to $1 \times 10^{20}$ atoms/cm$^3$. The layer 144 can be substantially free of Al, and thus the Al content is less than 0.1 atomic % based on cation content within the layer 144. The layer 144 can have a thickness in a range of 4 nm to 100 nm, and in an embodiment, the layer 144 may have a thickness no greater than 50 nm.

A gate dielectric layer 164 overlies the layer 144. The gate dielectric layer 164 can include a nitride, an oxide, or an oxynitride. An exemplary material for the gate dielectric layer 164 includes Si3N4, Al2O3, AlN, or the like. The gate dielectric layer 164 has a thickness in a range of 2 nm to 100 nm, and in a particular embodiment is in a range of 5 nm to 30 nm.

A gate electrode 184 overlies the gate dielectric layer 164 and includes a conductive layer. The conductive layer has a composition selected to provide a proper work function for the transistor being formed. In another embodiment, the conductive layer can include a conductive bulk film. The bulk film can include Al, Cu, or another material that is more conductive than other films within the conductive layer. In an embodiment, the bulk film can include at least 90 atomic % Al. The bulk film is typically the thickest film within the conductive layer. In an embodiment, the bulk film has a thickness in a range of 20 nm to 1000 nm. In a particular embodiment, the bulk film has a thickness in a range of 50 nm to 500 nm. In an embodiment, the bulk film is the only film within the conductive layer.

In another embodiment, one or more other films may be used with the bulk film in the conductive layer. An exemplary film can be an anti-diffusion film, an antireflective film, or the like. The film has a different composition as compare to the bulk film. In an embodiment, the film can include TiN, W, TiW, Pd, Pt, W, Au, Ni, or a stack or any combination thereof.

A source electrode 182 and a drain electrode 186 extend through openings in the capping layer 130 and contact the layer 124. Each of the source and drain electrodes 182 ad 186 overlie portions of the two-dimensional electron gas 126. The source and drain electrodes 182 and 186 overlie the layer 124 and, in an embodiment, can be recessed within the layer 124. The source and drain electrodes 182 and 186 include a conductive layer. The conductive layer for the source and drain electrodes 182 and 186 can have any of the compositions and thicknesses as previously described with respect to the conductive layer for the gate electrode 184. The source, gate, and drain electrodes 182, 184, and 186 can have the same or different compositions and can have the same or different thicknesses.

In a finished electronic device, other layers may be present. One or more additional insulating layers and one or more interconnect layers may be formed. In a particular embodiment, the one or more interconnect layers can be used to provide shielding to reduce gate-to-drain capacitance. US 2017/0294530 discloses interconnects that can be used to provide shielding and incorporated herein by reference for its teachings of interconnect used to provide shielding.

Figure 2:
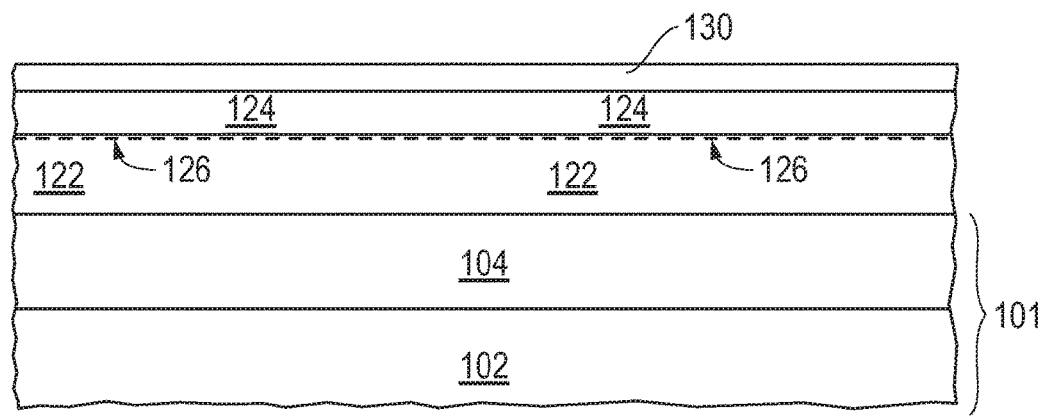
FIG. 2 includes an illustration of a cross-sectional view of the workpiece of FIG. 1 earlier in the process after forming layers over a substrate.
Figure 3:
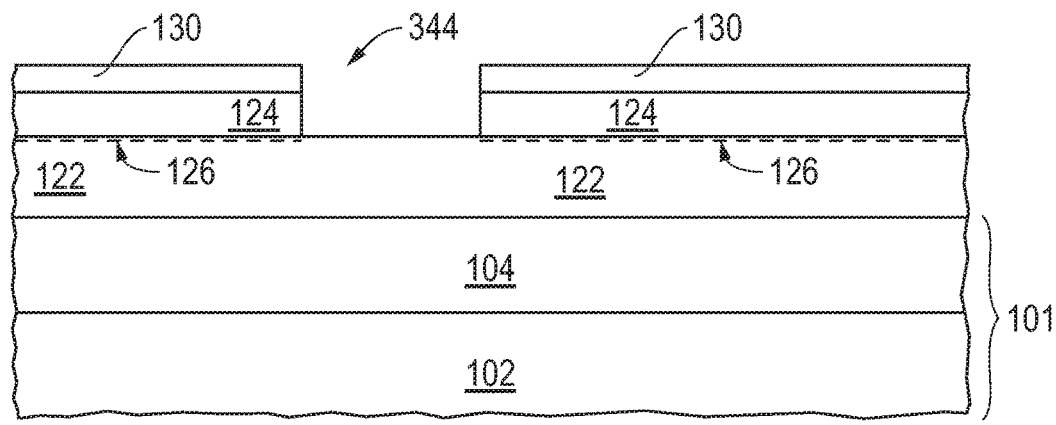
FIG. 3 includes an illustration of a cross-sectional view of the workpiece of FIG. 2 after patterning some of the layers to define an opening.
Figure 4:
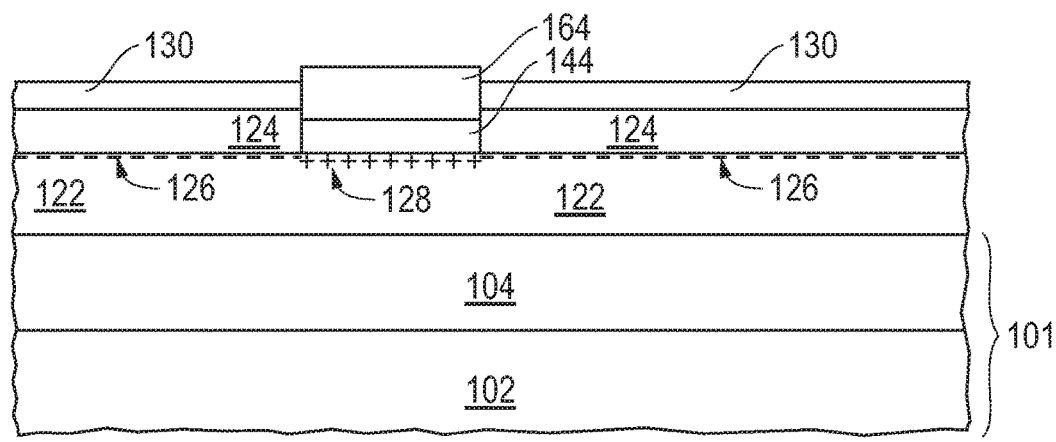
FIG. 4 includes an illustration of a cross-sectional view of the workpiece of FIG. 3 after forming another layer and a gate dielectric layer within the opening.

FIGS. 2 to 4 include illustrations of the device at different points in an exemplary fabrication process. Referring to FIG. 2, layers 104, 122, 124, and 130 can be serially formed over the base material 102. The layers 104, 122, 124, and 130 can have any of the compositions and thicknesses as previously described for each particular layer. In a particular embodiment, all of the layers 104, 122, 124, and 130 can be deposited without breaking vacuum. In a particular embodiment, the base material 102 may be monocrystalline, and layers 104, 122, and 124 can be epitaxially grown from its corresponding underlying layer.

The layers 124 and 130 can be patterned to define an opening 344, as illustrated in FIG. 3. A bottom of the opening 344 can include the layer 122. In a particular embodiment, the opening 344 may be recessed within the layer 122 to a depth no greater than 10 nm. In another embodiment, a thin strip of the layer 124 may lie along the bottom of the opening 344 and have a thickness no greater than 2 nm.

Layers 144 and 164 are formed within the opening, as illustrated in FIG. 4. The layers 144 and 164 can have any of the compositions and thicknesses as previously described for each particular layer. The layer 144 may be selectively deposited, such that the layer 144 is formed only within the opening and not over the capping layer 130. In a particular embodiment, the layer 144 is epitaxially grown from the layer 122 or from both layers 122 and 124. In another embodiment, the deposition is not selective, and the layer 144 is formed within the opening and over the capping layer 130. The gate dielectric layer 164 is formed over the layer 144 and the capping layer 130. Portions of the layers 144 and 164 lying outside the opening are removed as illustrated in FIG. 4. In another embodiment, the layer 144 is within the opening; however, the gate dielectric layer 164 may remain over portion of the capping layer 130 (not illustrated in FIG. 4).

The source, gate, and drain electrodes 182, 184, and 186 are then formed as illustrated in FIG. 1. In one embodiment, the conductive layer of the gate electrode 184 can be formed over the gate dielectric layer 164. The gate dielectric layer 164 may be patterned before depositing the conductive layer for the gate electrode 184 or may be patterned after forming the gate electrode 184. The source and drain electrodes 182 and 186 can be formed during the same or separate process sequence as the gate electrode 184. The layer 124 is patterned to remove some, but not all, of the thickness of the layer 124, such that remaining portions of the layer 124 underlie the openings where the source and drain electrodes 182 and 186 are formed. If the gate dielectric layer 164 overlies the capping layer 130, the gate dielectric layer 164 is patterned to define openings where the source and drain electrodes 182 and 186 are formed. A conductive layer is deposited and patterned to form the source and drain electrodes 182 and 186.

In an embodiment, the source and drain electrodes 182 and 186 are formed during a different process sequence as compared to the gate electrode 184. The source and drain electrodes 182 and 186 can be formed before or after the gate electrode 184. In another embodiment, the source, gate, and drain electrodes 182, 184, and 186 can be formed from the same conductive layer.

The process sequence illustrated in FIGS. 2 to 4 is illustrative of a particular embodiment. In another embodiment, the layers 104, 122, 144, and 164 can be serially formed over the base material 102. The layers 144 and 164 can be patterned, and the layers 124 and 130 can be formed after the layers 144 and 164 are patterned. After reading this specification, skilled artisans will be able to determine a process flow for a particular application.

The HEMT 100 is an enhancement-mode transistor. After voltages are placed on the source and drain electrodes 182 and 186, the HEMT 100 can be turned on by placing the gate electrode 184 at a voltage higher than the threshold voltage of the HEMT 100. When the voltage is removed from the gate electrode 184, the HEMT 100 turns off. The HEMT 100 has a threshold voltage greater than 1 V, and in an embodiment, the threshold voltage is at least 1.2 V or at least 1.5 V. The relative Al content of the third layer 144 with respect to the first layer 122, and the thickness of the gate dielectric layer 164 can be selected to provide a desired threshold voltage, which is greater than 1 V but at most 20 V.

The HEMT 100 has an $R_{DSON}$ that is similar to a depletion-mode HEMT having an unintentionally doped GaN channel layer and an AlGaN barrier layer overlying the channel layer and the same source-to-gate and gate-to-drain lengths. As used herein, length is measured in the direction of current flow when the transistor is on. The HEMT 100 can be better controlled as the threshold voltage is higher than many conventional enhancement-mode HEMTs.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

An electronic device including a transistor can include a first layer including a first III-V material having a first Al content; a second layer contacting the first layer and including a second III-V material having a second Al content that is greater than the first Al content; and a third layer overlying the first layer and at least partially extending through the second layer, wherein the third layer has a lower Al content than the first layer and includes $Al_zGa_{(1-z)}N$, wherein $0.00 \leq z \leq 0.10$.

Embodiment 2

The electronic device of Embodiment 1, wherein the third layer is recessed by no more than 10 nm into the first layer.

Embodiment 3

The electronic device of Embodiment 1, wherein based on cation content, the second Al content is 15 atomic % to 30 atomic % greater than the first Al content.

Embodiment 4

The electronic device of Embodiment 1, wherein the first layer includes $Al_xGa_{(1-x)}N$, wherein $0.05 \le x \le 0.20$, and the second layer includes $Al_yGa_{(1-y)}N$, wherein $0.20 \le y \le 0.50$.

Embodiment 5

The electronic device of Embodiment 4, wherein the third layer includes unintentionally doped or p-type doped GaN.

Embodiment 6

The electronic device of Embodiment 4, wherein the first layer has a thickness in a range of 20 nm to 2000 nm, the second layer has a thickness in a range of 4 nm to 100 nm, and the third layer has a thickness in a range of 4 nm to 100 nm.

Embodiment 7

The electronic device of Embodiment 4, wherein the second layer includes a first portion and a second portion spaced apart from the first portion by a space, wherein the third layer is disposed within the space between the first and second portions of the second layer.

Embodiment 8

The electronic device of Embodiment 1, wherein the transistor is an enhancement-mode high electron mobility transistor.

Embodiment 9

The electronic device of Embodiment 8, wherein a two-dimension electron gas lies at an interface between the first and second layers, and a two-dimension hole gas underlies the third layer.

Embodiment 10

An electronic device including a transistor can include:
a first layer including a first III-V material;
a second layer overlying the first layer and including a second III-V material;
a third layer overlying the first layer and including a third III-V material;
a gate dielectric layer overlying the third layer; and
a gate electrode of the transistor overlying the gate dielectric layer and the third layer,
wherein:
  each of the first, second, and third layers has a different composition as compared to one another,
  the second layer has a first portion coupled to a source electrode of the transistor and a second portion coupled to a drain electrode of the transistor, and
  the third layer is disposed between the first and second portions of the second layer.

Embodiment 11

The electronic device of Embodiment 10, wherein a two-dimension electron gas lies at an interface between the first and second layers, and a two-dimension hole gas underlies the third layer.

Embodiment 12

The electronic device of Embodiment 10, wherein the first and second layers include Al, and the second layer has a higher Al content as compared to the first layer.

Embodiment 13

The electronic device of Embodiment 12, wherein based on cation content, the second layer has 15 atomic % to 30 atomic % more Al than the first layer.

Embodiment 14

The electronic device of Embodiment 13, wherein based on cation content, the first layer has 5 atomic % to 20 atomic % Al.

Embodiment 15

The electronic device of Embodiment 11, wherein the first layer includes $Al_xGa_{(1-x)}N$, wherein $0.05 \le x \le 0.20$, the second layer includes $Al_yGa_{(1-y)}N$, wherein $0.20 \le y \le 0.50$, and the third layer includes $Al_zGa_{(1-z)}N$, wherein $0.00 \le z \le 0.10$.

Embodiment 16

The electronic device of Embodiment 15, wherein the transistor is an enhancement-mode high electron mobility transistor having a threshold voltage greater than 1 V.

Embodiment 17

The electronic device of Embodiment 10, wherein:
the first layer includes $Al_xGa_{(1-x)}N$, wherein $0.05 \le x \le 0.20$ and has a thickness in a range of 20 nm to 2000 nm,
the second layer includes $Al_yGa_{(1-y)}N$, wherein $0.20 \le y \le 0.50$ and has a thickness in a range of 4 nm to 100 nm,
based on cation content, the second layer has 15 atomic % to 30 atomic % more Al than the first layer,
the third layer includes unintentionally doped or p-type doped GaN and has a thickness in a range of 4 nm to 100 nm,
the second layer includes a first portion spaced apart from a second portion by a space, wherein the third layer is disposed within the space between the first and second portions,
the third layer is recessed by no more than 10 nm into the first layer,
the transistor is an enhancement-mode high electron mobility transistor,
a two-dimension electron gas lies at an interface between the first and second layers, and a two-dimension hole gas lies at an interface between the first and third layers.

Embodiment 18

A process of forming an electronic device can include forming a first layer over a substrate, wherein the first layer includes a first III-V material having a first Al content; forming a second layer contacting the first layer and including a second III-V material having a second Al content that is greater than the first Al content; and forming a third layer over the first layer and at least partially extending through the second layer, wherein the third layer has a lower Al content than the first layer and includes $Al_zGa_{(1-z)}N$, wherein $0.00 \le z \le 0.10$.

Embodiment 19

The process of Embodiment 18, wherein forming the first layer includes forming the first layer including $Al_xGa_{(1-x)}N$, wherein $0.05 \le x \le 0.20$, forming the second layer includes forming the second layer including $Al_yGa_{(1-y)}N$, wherein $0.20 \le y \le 0.50$, and forming the third layer includes forming the third layer including unintentionally doped or p-type doped GaN.

Embodiment 20

The process of Embodiment 19, further including patterning the second layer to form a first portion and a second portion spaced apart from the first portion by a space, wherein forming the third layer includes forming the third layer within the space between the first and second portions of the second layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device including a transistor comprising:
   a first layer including a first III-V material having a first Al content;
   a second layer contacting the first layer and including a second III-V material having a second Al content that is greater than the first Al content; and
   a third layer overlying the first layer and at least partially extending through the second layer, wherein the third layer has a lower Al content than the first layer and includes $Al_zGa_{(1-z)}N$, wherein $0.00 \le z \le 0.10$.

2. The electronic device of claim 1, wherein the third layer is recessed by no more than 10 nm into the first layer.

3. The electronic device of claim 1, wherein based on cation content, the second Al content is 15 atomic % to 30 atomic % greater than the first Al content.

4. The electronic device of claim 1, wherein:
   the first layer includes $Al_xGa_{(1-x)}N$, wherein $0.05 \le x \le 0.20$, and
   the second layer includes $Al_yGa_{(1-y)}N$, wherein $0.20 \le y \le 0.50$.

5. The electronic device of claim 4, wherein the third layer includes unintentionally doped or p-type doped GaN.

6. The electronic device of claim 4, wherein:
   the first layer has a thickness in a range of 20 nm to 2000 nm,
   the second layer has a thickness in a range of 4 nm to 100 nm, and
   the third layer has a thickness in a range of 4 nm to 100 nm.

7. The electronic device of claim 4, wherein the second layer includes a first portion and a second portion spaced apart from the first portion by a space, wherein the third layer is disposed within the space between the first and second portions of the second layer.

8. The electronic device of claim 1, wherein the transistor is an enhancement-mode high electron mobility transistor.

9. The electronic device of claim 8, wherein:
   a two-dimension electron gas lies at an interface between the first and second layers, and
   a two-dimension hole gas underlies the third layer.

10. An electronic device including a transistor comprising:
    a first layer including a first III-V material;
    a second layer overlying the first layer and including a second III-V material;
    a third layer overlying the first layer and including a third III-V material;
    a gate dielectric layer overlying the third layer; and
    a gate electrode of the transistor overlying the gate dielectric layer and the third layer,
    wherein:
       each of the first, second, and third layers has a different composition as compared to one another,
       the second layer has a first portion coupled to a source electrode of the transistor and a second portion coupled to a drain electrode of the transistor,
       upper surface of the first and second portions of the second layer lie at an elevation higher than a lower surface of the third layer, and
       the third layer is disposed between the first and second portions of the second layer.

11. The electronic device of claim 10, wherein:
a two-dimension electron gas lies at an interface between the first and second layers, and
a two-dimension hole gas underlies the third layer.

12. The electronic device of claim 10, wherein the first and second layers include Al, and the second layer has a higher Al content as compared to the first layer.

13. The electronic device of claim 12, wherein based on cation content, the second layer has 15 atomic % to 30 atomic % more Al than the first layer.

14. The electronic device of claim 10, wherein, between the first and second portions of the second layer, the lower surface of the third layer contacts the first layer or the second layer.

15. The electronic device of claim 11, wherein:
the first layer includes $Al_xGa_{(1-x)}N$, wherein $0.05 \leq x \leq 0.20$,
the second layer includes $Al_yGa_{(1-y)}N$, wherein $0.20 \leq y \leq 0.50$, and
the third layer includes $Al_zGa_{(1-z)}N$, wherein $0.00 \leq z \leq 0.10$.

16. The electronic device of claim 15, wherein the transistor is an enhancement-mode high electron mobility transistor having a threshold voltage greater than 1 V.

17. The electronic device of claim 10, wherein:
the first layer includes $Al_xGa_{(1-x)}N$, wherein $0.05 \leq x \leq 0.20$ and has a thickness in a range of 20 nm to 2000 nm,
the second layer includes $Al_yGa_{(1-y)}N$, wherein $0.20 \leq y \leq 0.50$ and has a thickness in a range of 4 nm to 100 nm,
based on cation content, the second layer has 15 atomic % to 30 atomic % more Al than the first layer,
the third layer includes unintentionally doped or p-type doped GaN and has a thickness in a range of 4 nm to 100 nm,
the second layer includes a first portion spaced apart from a second portion by a space, wherein the third layer is disposed within the space between the first and second portions,
the third layer is recessed by no more than 10 nm into the first layer,
the transistor is an enhancement-mode high electron mobility transistor,
a two-dimension electron gas lies at an interface between the first and second layers, and
a two-dimension hole gas lies at an interface between the first and third layers.

18. A process of forming an electronic device comprising:
forming a first layer over a substrate, wherein the first layer includes a first III-V material having a first Al content;
forming a second layer contacting the first layer and including a second III-V material having a second Al content that is greater than the first Al content; and
forming a third layer over the first layer and at least partially extending through the second layer, wherein the third layer has a lower Al content than the first layer and includes $Al_zGa_{(1-z)}N$, wherein $0.00 \leq z \leq 0.10$.

19. The process of claim 18, wherein:
forming the first layer comprises forming the first layer including $Al_xGa_{(1-x)}N$, wherein $0.05 \leq x \leq 0.20$,
forming the second layer comprises forming the second layer including $Al_yGa_{(1-y)}N$, wherein $0.20 \leq y \leq 0.50$, and
forming the third layer comprises forming the third layer including unintentionally doped or p-type doped GaN.

20. The process of claim 19, further comprising patterning the second layer to form a first portion and a second portion spaced apart from the first portion by a space, wherein forming the third layer comprises forming the third layer within the space between the first and second portions of the second layer.

* * * * *